United States Patent [19]

Wang

[11] Patent Number: 5,187,120

[45] Date of Patent: Feb. 16, 1993

[54] SELECTIVE DEPOSITION OF METAL ON METAL NITRIDE TO FORM INTERCONNECT

[75] Inventor: Shein-Sen M. Wang, Cupertino, Calif.

[73] Assignee: Hewlett-Packard Company, Palo Alto, Calif.

[21] Appl. No.: 934,376

[22] Filed: Aug. 24, 1992

[51] Int. Cl.$^5$ .......................................... H01L 21/443
[52] U.S. Cl. ................................... 437/192; 437/200; 437/246
[58] Field of Search ............... 437/190, 192, 200, 246; 748/DIG. 20; 357/71

[56] References Cited

U.S. PATENT DOCUMENTS

| | | | |
|---|---|---|---|
| 4,822,753 | 4/1989 | Pintchovski et al. | 437/192 |
| 4,851,369 | 7/1989 | Ellwanger et al. | 437/200 |
| 4,937,657 | 6/1990 | De Blasi et al. | 357/71 |
| 4,960,732 | 10/1990 | Dixit et al. | 437/192 |
| 4,981,550 | 1/1991 | HuHemann et al. | 156/643 |
| 4,994,301 | 2/1991 | Kusumoto et al. | 437/192 |
| 4,994,410 | 2/1991 | Sun et al. | 437/192 |

FOREIGN PATENT DOCUMENTS

| | | | |
|---|---|---|---|
| 63-55932 | 3/1988 | Japan | 437/192 |
| 63-62228 | 3/1988 | Japan | 437/190 |
| 2-119138 | 5/1990 | Japan | 437/192 |
| 2-241032 | 9/1990 | Japan | 437/190 |

OTHER PUBLICATIONS

Broadbent, E. K., "Growth of Selective Tungsten...", *J. Electrochem. Soc.*, vol. 133, No. 8, Aug. 1986, pp. 1715-1720.

M. F. C. Willemsen et al., "In Situ Investigation of TiN Formation on Top of TiSi$_2$", *Jour. Vac. Sci. Technol.*, vol. B6 (1988) pp. 53-61.

M. Wittmer, "Self-Aligned Diffusion Barrier by Nitridization of TiSi$_2$", *Appl. Phy. Lett.*, vol. 52 (1988) pp. 1573-1575.

R. V. Joshi et al., "Novel Self-Aligned W/TiN/TiSi$_2$ Contact Structure for Very Shallow Junctions and Interconnections", *Appl. Phys. Lett.*, vol. 54 (1989) pp. 1672-1674.

*Primary Examiner*—T. N. Quach

[57] ABSTRACT

A method for forming an aperture in a semiconductor oxide layer to form an electrical interconnect (via or contact) for a multi-layer semiconductor circuit. This method allows preferential deposit of tungsten in the aperture but resists deposit of tungsten on the oxide exposed surface. Before the tungsten is deposited, a layer of a first phase of titanium nitride (or tungsten nitride), which promotes nucleation of tungsten thereon, is formed within the aperture; and an overlayer of a second phase of titanium nitride (or tungsten nitride), which resists nucleation of tungsten thereon, is formed on the oxide exposed surface. The tungsten is then deposited preferentially on the titanium nitride (or tungsten nitride) layer within the aperture, but not on the titanium nitride (or tungsten nitride) overlayer on the oxide layer. The overlayer of titanium nitride (or tungsten nitride) and part of all of the oxide layer may be removed to expose an electrical contact. The titanium nitride and titanium silicide may be replaced by a metal nitride MN and a metal silicide MSi$_x$(1<x<2), where M is one of the metals Zr, Hf, V, Nb, Ta, Cr and Mo.

18 Claims, 3 Drawing Sheets

મ,187,120

SELECTIVE DEPOSITION OF METAL ON METAL NITRIDE TO FORM INTERCONNECT

FIELD OF THE INVENTION

This invention relates to fabrication of a microelectronic circuit, and more particularly to selective deposition of a metal on a semiconductor material.

BACKGROUND OF THE INVENTION

As semiconductor device circuit line dimensions are reduced below 0.5 micron ("$\mu$m"), a multi-layer metallization process faces several challenges, including adequate metal step coverage for electrical interconnects, clean patterning on individual layers and planarization. Metal deposition to define an electrical contact or an electrical interconnect between two layers is often performed by metal sputtering. Where an electrical via for interconnect purposes has a high aspect ratio, or ratio of depth to diameter of the via, traditional metal sputtering, such as TiW/Al/TiW, has become a limiting process in submicron designs, because of poor metal step coverage, poor electro-migration resistance and higher-than-acceptable electrical contact resistance.

An attractive alternative here is chemical vapor deposition ("CVD") of tungsten in the vias and on electrical contact regions. However, this requires: (1) deposition with high selectively on silicon, on silicides and on metals and not on adjacent insulator oxides; (2) excellent resistance to electro-migration; and (3) improved conformal step coverage on vias with aspect ratios >1.

At least four problems must be overcome using this approach. First, trapping of a polycrystalline insulator material, such as titanium trifluoride, $TiF_3$, at the $W/TiS_2$ interface adjacent to a via or an electrical contact will induce high contact resistance. Second, presence of even a small amount of oxygen, such as titanium oxide, at the top or exposed layer of titanium silicide, $TiSi_2$, depresses nucleation of tungsten deposited by CVD on $TiSi_2$. Third, if tungsten is to be used to form an electrical contact or to provide an electrical interconnect by filling a via, the area of the contact and the depth and diameter of the via can vary greatly. For example, a deep and wide via might be filled only partially and a shallow via might quickly overfill, for different depth vias on a single layer of a multi-layer semiconductor circuit. Fourth, selectivity loss on an oxide surface in tungsten deposition may induce severe defects and jeopardize circuit yield. During CVD of tungsten, an exposed adjacent oxide surface may become contaminated or altered by a photoresist patterning process so that the altered oxide behaves as a tungsten nucleation layer that will induce severe defects, cause short circuits and jeopardize circuit yield.

What is needed is a tungsten deposition process for electrical contacts and vias that (1) is highly selective for W deposition on silicon, silicide and metal, (2) allows W deposition in vias and as electrical contacts over a wide range of via depths and diameters and contact areas, and (3) provides very low contact resistance at a $W/TiSi_x$ interface.

SUMMARY OF THE INVENTION

These needs are met by the invention, which provides in one embodiment a method for selective production of titanium nitride, TiN, in two different "phases". In a first phase, TiN(I) allows nucleation of W thereon relatively easily and provides excellent W interface contact resistance in an interconnect chain such as Al/TiN-(I)/CVD W (resistivity $\approx 2.5 \times 10^{-9}$ Ohm-cm at room temperature). A second phase TiN(II) resists nucleation of W thereon and can suppress or hold off W nucleation thereon for time intervals 10-100 times as long as the time interval required for nucleation of W on silicon oxide under the same conditions for W deposition. The second phase TiN(II) provides a stable material surface that prevents W nucleation where W is not wanted. The measured sheet electrical resistivities of TiN(I) and TiN(II) are similar, 65 $\mu$ohm-cm and 70 $\mu$ohm-cm, respectively. The invention also allows conversion of $TiSi_x$ to TiN(I) for subsequent SCVD of W thereon.

In one embodiment, the invention includes the steps of: (1) forming a layer of $TiSi_x$ at a temperature $T \leq 600°$ C.; (2) implanting N ions in the $TiSi_x$ layer, to a depth of about 0.005–0.02 $\mu$m; (3) growing an oxide layer over the $TiSi_x$ layer; (4) forming a layer of TiN(II) on the top surface of the remainder of the oxide layer, to form an anti-W nucleation layer on the oxide layer top surface; (5) depositing a layer of photoresist material over the oxide layer; (6) forming apertures in the photoresist layer at the positions of, and with diameters equal to the diameters of, an electrical interconnect to be formed in the oxide layer, by exposure and development of the photoresist layer; (7) etching an interconnect aperture in the oxide layer to expose the underlying $TiSi_x$ layer; (8) removing the remaining photoresist layer; (9) rapidly annealing the structure at a temperature $T \leq 900°$ C. in an $NH_3$ atmosphere to produce a layer of TiN(I) of thickness about 0.005–0.02 $\mu$m that overlies the remainder of the Ti—Si layer below the aperture; and (10) growing W in the aperture to the desired height therein.

The phase "electrical contact" is often reserved for an electrical interconnect directly to a device, and the phase "electrical via" is often reserved for an electrical interconnect between two layers of a device. The invention disclosed here is applicable to formation of both electrical contacts and electrical vias, and the phrase "electrical interconnect" is used to refer to either contacts or vias.

DETAILED DESCRIPTION

Figure 1:
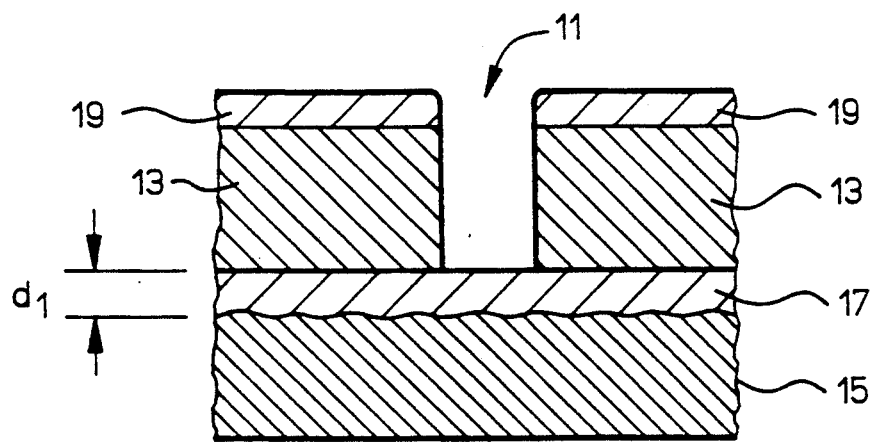
FIG. 1 is a sectional side view of a via after selective chemical vapor deposition of tungsen therein according to the invention.

FIG. 1 shows an embodiment of an aperture 11 that will serve as an electrical interconnect according to the invention. An aperture 11 for a via is formed in an oxide layer 13 to expose an underlying layer 15 of $TiSi_x$ (1<x<2), where a thin, top layer 17 of the $TiSi_x$ layer has been converted to an electrically conductive TiN(phase I) that promotes rapid nucleation of W on this top layer. The top surface of the oxide layer 13 then has a layer 19 of TiN(phase II) sputtered or otherwise formed thereon, where TiN(II) resists and opposes W nucleation thereon. The metal W is then selectively formed as an electrical interconnect volume 21 in the aperture 11 but not on the adjacent surfaces that contain the TiN(II) layer. The TiN(II) layer may then be left in place or removed, depending upon the subsequent processing steps to be performed. If an electrical contact using W is to be formed, the volume 21 of W material can be filled in the aperture above the top of the TiN(II) layer to expose the top of the W electrical contact, if desired, because the TiN(II) overlayer will resist W nucleation thereon. The interconnect shown in FIG. 1 may be filled in with W and may have a diameter as small as 0.25 μm, with an arbitrary aspect ratio (ratio of depth to diameter for the aperture) that can be greater than 10.1 if desired. An electrical interconnect, constructed as indicated in FIG. 1, may have a diameter as small as 0.25 μm and may have an arbitrary height.

Figure 2:
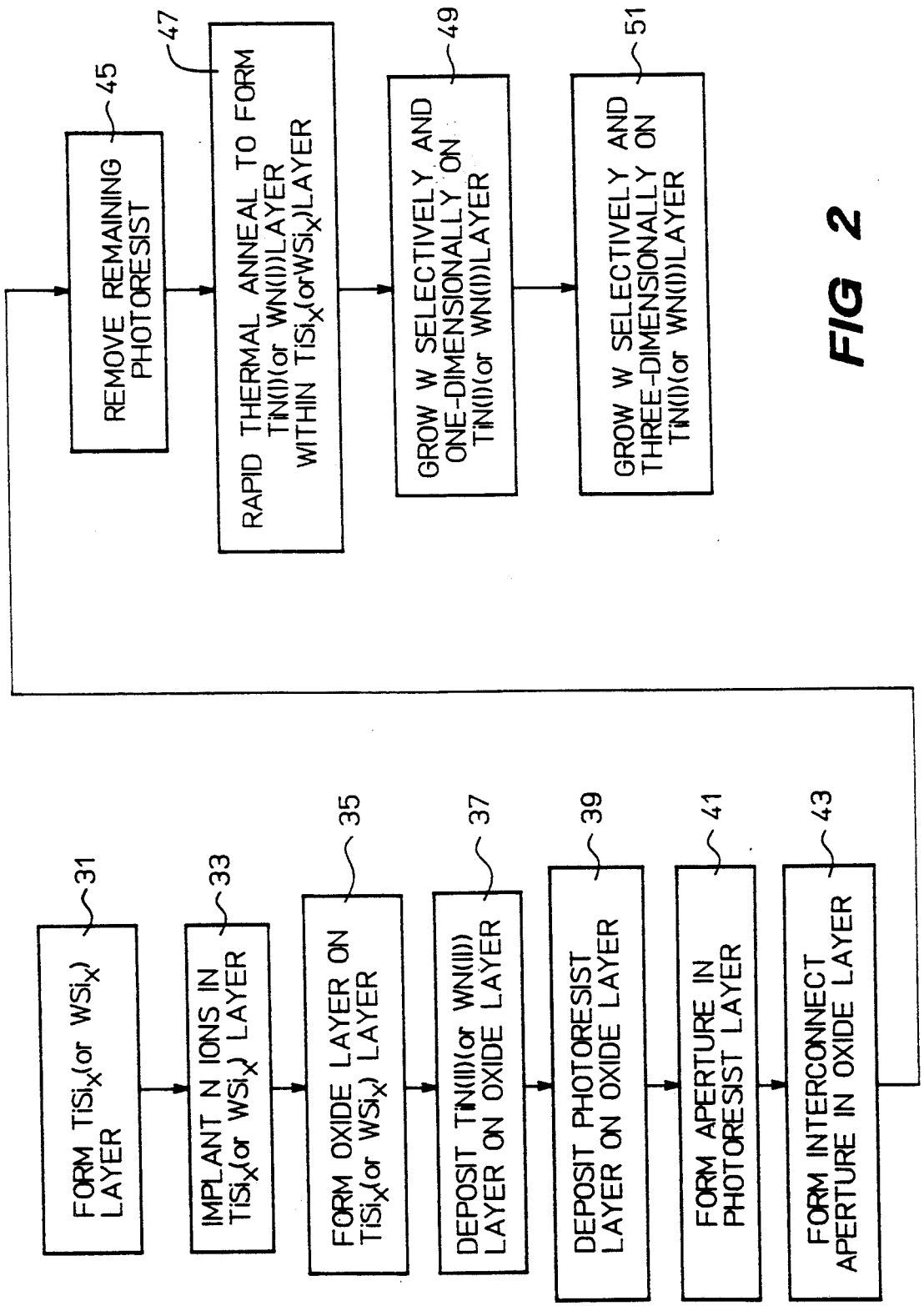
FIG. 2 is a flow chart illustrating SCVD of tungsten according to one embodiment of the invention.

FIG. 2 is a flow diagram illustrating the steps used to form the embodiment shown in FIG. 1. In step 31, an electrically conducting TiSi$_x$ layer of thickness at least 0.05 μm at a temperature T≦600° C. if formed, with $1<x<2$ and x preferably as small as possible. In step 33, the TiSi$_x$ layer is implanted with N ions in this layer at a shallow depth of about $d_1=0.005-0.02$ μm, using an N ion beam of energy 30-50 keV and dose in the range of $5\times10^{16}-1\times10^{17}$ cm$^{-2}$ for this purpose. The depth $d_1$ is preferably as small as possible, consistent with the stated lower bound. An oxide layer of arbitrary thickness is then formed on the TiSi$_x$ layer in step 35. A layer of a second phase of TiN, referred to as TiN(II), of thickness about 0.01-0.05 μm is formed on the oxide layer in step 37, using chemical vapor deposition or sputtering at a temperature T≦400° C. A layer of positive photoresist material is then formed over the oxide layer in step 39. In steps 41 and 43, an aperture for an electrical interconnect is then formed in the photoresist and oxide layers, at the position and at the diameter desired, to expose the underlying TiSi$_x$ layer, using photoresist exposure, development etch techniques that are well known in the art. The remaining photoresist material is then removed in step 45. In step 47, a rapid thermal anneal in an NH$_3$ atmosphere is performed at a temperature T=900°-1,000° C. for a time interval Δt=20-40 sec, to convert a thin top layer of thickness 0.0005-0.02 μm within the aperture, containing the TiSi$_x$ and implanted N ions, to a upper layer of a first phase of TiN, referred to as TiN(I), and a lower layer of TiSi$_2$. Any excess Si ions are segregated to an Si-rich region below the TiN(I) and TiSi$_2$ layers. This Si-rich region may have an undesirably high resistivity, and it is therefore preferably that the thickness of this region be kept as small as possible.

Figure 3:
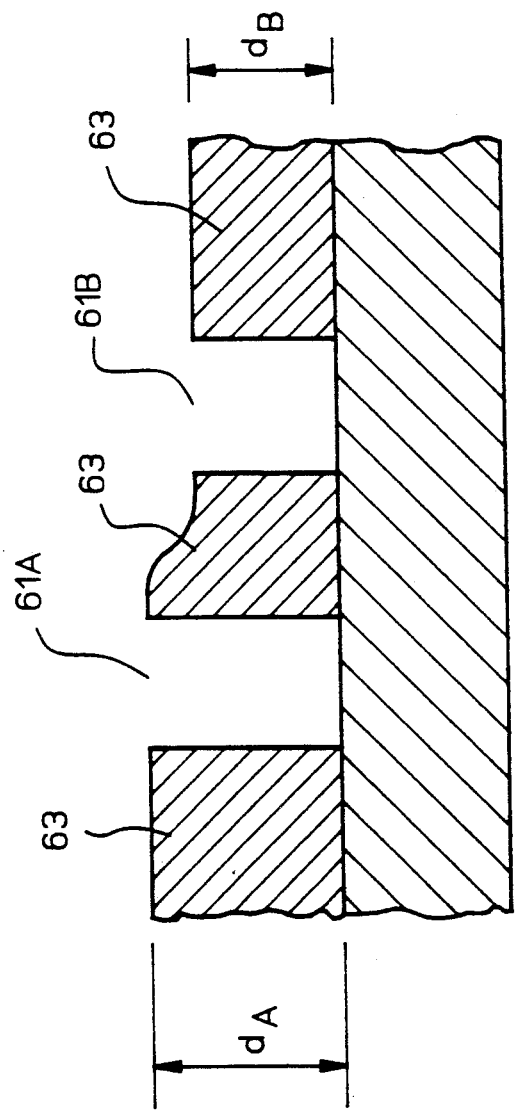
FIG. 3 illustrates use of the invention with apertures of two different depths.

Tungsten metal (W) is then grown preferentially in the aperture provided to fill this aperture in step 49. The W volume is initially grown one-dimensionally in the aperture 11 shown in FIG. 1, using an ambient atmosphere consisting of approximately 8 parts WF$_6$ to 100 parts SiH$_4$ to 400 parts H$_2$ (buffer) at a total gas pressure in the range 1-100 Torr. In this one-dimensional growth period, W nucleates on and grows on only the TiN(I) layer positioned at the bottom of the aperture 11. With reference to FIG. 3, if two or more apertures 61A and 61B having different aperture depths $d_A$ and $d_B(<d_A)$, respectively, in a layer 63 of semiconductor material are to be filled with W for interconnect purposes, the aperture 61B will become filled first if only one-dimensional growth is promoted here.

If the ambient atmosphere is changed to approximately 20 parts WF$_6$ to 100 parts SiH$_4$ to 1,000 parts H$_2$ (buffer) at a total gas pressure in the range 1-100 Torr, the W will nucleate on the exposed TiN(I) at the aperture bottom and on the aperture side walls, which are primarily oxide. The W will then grow upward from the TiN(I) layer and inward from the oxide side walls, thus manifesting three-dimensional growth of the W. Three-dimensional growth of W in the aperture, as in step 51 in the flow diagram of FIG. 2, proceeds more quickly than one-dimensional growth therein, and the remainder of the volume of the aperture 61A is filled without promoting growth of the W above a desired top plane that is common to the two apertures 61A and 61B. The overlayer of TiN(II) resists W nucleation thereon, and n W is grown on this overlayer. The procedure illustrated in FIG. 2 is a selective chemical vapor deposition ("SCVD") method that produces an electrical interconnect with wide tolerances for diameter and thickness.

If N(W; X) represents the rate of nucleation of W on an exposed surface of the element or compound X, the following order of nucleation rates prevails in an appropriate temperature range:

N(W; TiN(II))<<N(W; oxide)<N(W; metal)<N(W; TiN(I)).

Figure 4:
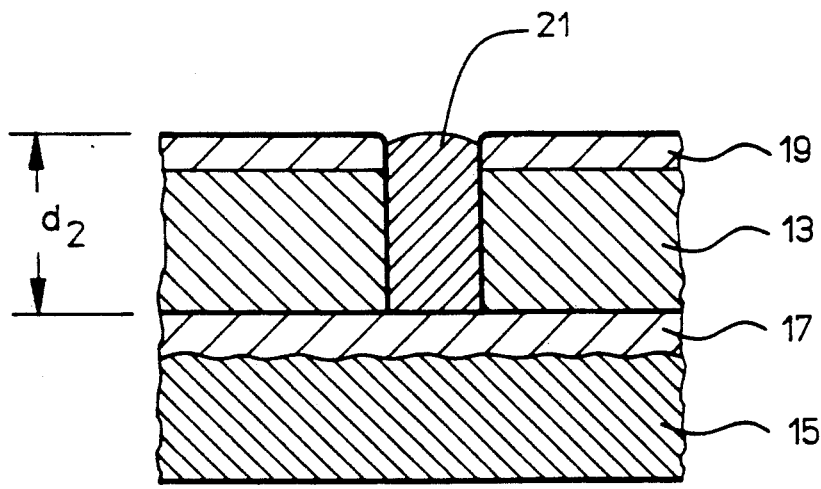
FIGS. 4 and 5 illustrate an electrical via and an electrical contact, respectively, formed according to the invention.
Figure 5:
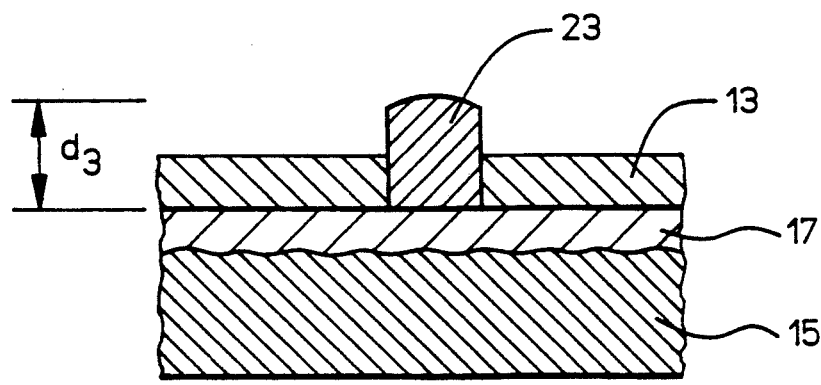

Thus, W will nucleate on the oxide side walls of the aperture 61A or 61B much more easily than W will nucleate on the TiN(II) overlayer. This difference is responsible for three-dimensional growth in the aperture volume, with little or no growth on the TiN(II) overlayer during the same time period.

Where an electrical interconnect is to be formed, the aperture 11 in FIG. 1 would be completely filled with a plug 21 of W, of an appropriate height $d_2$ (FIG. 4) corresponding to the depth of the aperture. Where an electrical contact is to be formed, the aperture would be filled with a plug 23 of W to an appropriate height $d_3$ (FIG. 5), and the overlayer 19 and the oxide layer 13 would be partly or completely removed to expose a contact region. The TiN(II) layer used in formation of an electrical via is preferably formed using sputtering of TiN on the oxide layer 13 in FIG. 1. The TiN(II) layer used in formation of an electrical contact may use either sputtering of chemical vapor deposition of TiN on the oxide layer 13.

Formation of TiN(II) is much more difficult than formation of TiN(I) and is performed by careful sputtering or CVD on a surface of appropriate material. The electrical resistivity and optical reflectivity at wavelength λ=0.365 μm of TiN(II) are about 60 μohm-cm and 20 percent, respectively, which are slightly less than the corresponding values for TiN(I). The crystallographic structures of TiN(I) and TiN(II) are both cubic. However, TiN(I) has a multi-vacancy defect structure, while the TiN(II) is a near-perfect structure with relatively few defects, and this difference may account for the difference in ease of W nucleation on these two materials.

In situ formation of TiN on a top surface of TiSi$_2$ is discussed by Willemsen et al., Jour. Vac. Sci Technol, vol. B6 (1988) pp. 53-61, incorporated by reference herein. One procedure required annealing, at a temperature T≈600° C., of a ti-containing film deposited on a Si surface in a nitrogen-containing atmosphere (N$_2$ or NH$_3$) and results in formation of a TiN-TiSi$_2$ double layer. This method often produces an intermediate layer of uncombined Ti. A second procedure requires use of annealing temperatures T>800° C., and an uncombined layer of Ti is not present. The Ti film is deposited by Ti sputtering on Si to a thickness of 90–100 nm. Titanium nitride, TiN, if formed only near the surface, at a fraction of the 99–100 nm depth of the Ti film, but the thickness of the TiN layer increases with initial thickness of the Ti-containing film. For annealing temperatures T>800° C., the rates of nitridization of TiSi$_2$ and of TiSi$_x$ in NH$_3$ are similar at the temperatures used. However, where an N$_2$ atmosphere is provided at these elevated annealing temperatures, the nitridization rate of TiSi$_x$ is 5–10 times the nitridization rate of TiSi$_2$ for such temperatures. Nitridization of TiSi$_x$ to form a TiN layer is also discussed by Wittmer, Appl. Phys. Lett., vol. 52 (1988) pp. 1573–1574, and by Joshi et al., Appl. Phys. Lett., vol. 54 (1989) pp. 1672–1674. None of these workers recognized that TiN can be prepared in at least two phases, with a first phase promoting W nucleation thereon and a second phase resisting W nucleation thereon.

Growth of W can also be preferentially nucleated on a layer of WN(phase I) formed on WSi$_y$ (1<y<2), where the WN(phase I) is formed from the WSi$_y$ in a manner similar to formation of the TiN(phase I) from the TiSi$_x$. An overlayer of WN(phase II) is formed on the exposed oxide surface 13 in FIG. 1 just as TiN(phase II) is formed on the oxide layer. Use of a thin WN(I) layer rather than a thin TiN(I) layer provides a slightly better fit with the W whose growth is to be nucleated on this layer.

Based upon some features of the band structure of any of a number of metals, it appears that growth of W can also be preferentially nucleated on a metal nitride layer (Me)N (phase I) formed on (Me)Si$_z$(1<z<2), where the phase I (Me)N is formed from the (Me)Si$_z$ in a manner similar to formation of the phase I TiN from the TiSi$_x$. Here, (Me) represents one of the metals Zr, Hf, V, Nb, Ta, Cr or Mo. It is known that choice of Fe or Co for this metal (Me) does not work well for this process. As before, an overlayer of phase II (Me)N is formed on the oxide layer and is relatively resistent to nucleation of W on this overlayer.

I claim:

1. A method of forming an electrical interconnect for a multi-layer semiconductor circuit, the method comprising the steps of providing a layer of a selected TiSi$_x$ (1<x<2) of predetermined electrical conductivity;

forming a thin first layer of TiN within the TiSi$_x$ layer;

forming an oxide layer of predetermined thickness on the TiN and TiSi$_x$ layer and having an exposed surface;

forming a second layer of TiN on the exposed surface of the oxide layer to form a second phase of TiN, denoted TiN(II);

providing an aperture of predetermined diameter in the oxide layer and the TiN(II) layer to expose a surface of the TiN layer within the aperture;

annealing the structure at a temperature T in the range 900°–1,000° C. for a time interval $\Delta t = 20$–40 sec to form an exposed TiN layer of a first phase, denoted TiN(I), and an adjacent TiSi$_2$ layer at the exposed surface within the aperture;

depositing W on the exposed surfaces of the structure, and allowing the W to grow upon the TiN(I) layer within the aperture but not on the TiN(II) layer on the oxide layer.

2. The method of claim 1, wherein the step of forming said first layer of TiN within said aperture comprises the step of implanting in said aperture N ions with kinetic energies in the range 30–50 keV and with a dose in the range $5 \times 10^{16}$–$1 \times 10^{17}$ cm$^{-2}$.

3. The method of claim 1, wherein said step of forming said second layer of TiN on said exposed top surface of said oxide layer comprises forming this layer by sputtering of TiN at a temperature $T \leq 400°$ C.

4. The method of claim 1, wherein said step of forming said second layer of TiN on said exposed top surface of said oxide layer comprises forming this layer by chemical vapor deposition of TiN at a temperature $T \leq 400°$ C.

5. The method of claim 1, further comprising the step of forming said first layer of TiN with a thickness lying in the range 0.005–0.02 μm.

6. The method of claim 1, further comprising the step of forming said second layer of TiN with a thickness lying in the range 0.01–0.005 μm.

7. A method of forming an electrical interconnect for a multi-layer semiconductor circuit, the method comprising the steps of providing a layer of a selected WSi$_x$ (1<x<2) of predetermined electrical conductivity;

forming a thin first layer of WN within the WSi$_x$ layer;

forming an oxide layer of predetermined thickness on the WN and WSi$_x$ layer and having an exposed surface;

forming a second layer of WN on the exposed surface of the oxide layer to form a second phase of WN, denoted WN(II);

providing an aperture of predetermined diameter in the oxide layer and the WN(II) layer to expose a surface of the WN layer within the aperture;

annealing the structure at a temperature T in the range 900°–1,000° C. for a time interval $\Delta t = 20$–40 sec to form an exposed WN layer of a first phase, denoted WN(I), and an adjacent WSi$_2$ layer at the exposed surface within the aperture;

depositing W on the exposed surfaces of the structure, and allowing the W to grow upon the WN(I) layer within the aperture but not on the WN(II) layer on the oxide layer.

8. The method of claim 7, wherein the step of forming said first layer of WN within said aperture comprises the step of implanting in said aperture N ions with kinetic energies in the range 30–50 keV and with a dose in the range $5 \times 10^{16}$–$1 \times 10^{17}$ cm$^{-2}$.

9. The method of claim 7, wherein said step of forming said second layer of WN on said exposed top surface of said oxide layer comprises forming this layer by sputtering of WN at a temperature $T \leq 400°$ C.

10. The method of claim 7, wherein said step of forming said second layer of WN on said exposed top surface of said oxide layer comprises forming this layer by chemical vapor deposition of WN at a temperature $T \leq 400°$ C.

11. The method of claim 7, further comprising the step of forming said first layer of WN with a thickness lying in the range 0.005–0.02 μm.

12. The method of claim 7, further comprising the step of forming said second layer of WN with a thickness lying in the range 0.01–0.05 μm.

13. A method of forming an electrical interconnect for a multi-layer semiconductor circuit, the method comprising the steps of providing a layer of a selected $MSi_x$ ($1<x<2$) of predetermined electrical conductivity, where M is a metal drawn from the group consisting of Zr, Hf, V, Nb, Ta, Cr and Mo;

forming a thin first layer of MN within the $MSi_x$ layer;

forming an oxide layer of predetermined thickness on the MN and $MSi_x$ layer and having an exposed surface;

forming a second layer of MN on the exposed surface of the oxide layer to form a second phase of MN, denoted MN(II);

providing an aperture of predetermined diameter in the oxide layer and the MN(II) layer to expose a surface of the MN layer within the aperture;

annealing the structure at a temperature T in the range 900°–1,000° C. for a time interval $\Delta t = 20$–$40$ sec to form an exposed MN layer of a first phase, denoted MN(I), and an adjacent $MSi_2$ layer at the exposed surface within the aperture;

depositing W on the exposed surfaces of the structure, and allowing the W to grow upon the MN(I) layer within the aperture but not on the MN(II) layer on the oxide layer.

14. The method of claim 13, wherein the step of forming said first layer of MN within said aperture comprises the step of implanting in said aperture N ions with kinetic energies in the range 30–50 keV and with a dose in the range $5 \times 10^{16}$–$1 \times 10^{17}$ cm$^{-2}$.

15. The method of claim 13, wherein said step of forming said second layer of MN on said exposed top surface of said oxide layer comprises forming this layer by sputtering of MN at a temperature $T \leq 400°$ C.

16. The method of claim 13, wherein said step of forming said second layer of MN on said exposed top surface of said oxide layer comprises forming this layer by chemical vapor deposition of MN at a temperature $T \leq 400°$ C.

17. The method of claim 13, further comprising the step of forming said first layer of MN with a thickness lying in the range 0.005–0.02 μm.

18. The method of claim 13, further comprising the step of forming said second layer of MN with a thickness lying in the range 0.01–0.05 μm.

* * * * *